United States Patent

Imaizumi

[11] Patent Number: 6,018,252
[45] Date of Patent: Jan. 25, 2000

[54] DUAL-POWER TYPE INTEGRATED CIRCUIT

[75] Inventor: Masato Imaizumi, Tokyo, Japan

[73] Assignee: NKK Corporation, Japan

[21] Appl. No.: 09/011,905

[22] PCT Filed: Jun. 16, 1997

[86] PCT No.: PCT/JP97/02061

§ 371 Date: Feb. 23, 1998

§ 102(e) Date: Feb. 23, 1998

[30] Foreign Application Priority Data

Jun. 21, 1996 [JP] Japan ................................ 8-161631

[51] Int. Cl.⁷ ........................................... H03K 19/0175
[52] U.S. Cl. ............................. 326/81; 326/83; 326/68; 326/121
[58] Field of Search ................................. 326/81, 80, 83, 326/86, 68, 119, 121

[56] References Cited

U.S. PATENT DOCUMENTS

| | | | |
|---|---|---|---|
| 4,656,373 | 4/1987 | Plus | 326/81 |
| 5,534,798 | 7/1996 | Phillips et al. | 326/108 |
| 5,559,464 | 9/1996 | Orii et al. | 327/333 |
| 5,789,942 | 8/1998 | Mizuno | 326/81 |
| 5,900,741 | 5/1999 | Roohparvar | 326/34 |

FOREIGN PATENT DOCUMENTS 2-196469  8/1990  Japan.
3-291015  12/1991  Japan.
6-77314  3/1994  Japan.

*Primary Examiner*—Michael Tokar
*Assistant Examiner*—Daniel D. Chang
*Attorney, Agent, or Firm*—Nixon & Vanderhye

[57] ABSTRACT

A dual-power type integrated circuit includes a ground terminal GND, a power source terminal VCC associated with the terminal GND to receive 3.3 V, a power source terminal VCCQ associated with the terminal GND to receive 2.5 V, an N-type semiconductor substrate 80 connected to the terminal VCC, a P-type well region 90 formed in the N-type semiconductor substrate and connected to the terminal GND, a logic processing section 50 which includes CMOS transistors 52, 54 formed in the N-type semiconductor substrate 80 and the P-type well region 90 and connected to operate at 3.3 V, and generates a logic signal with voltage amplitude of 3.3 V, and a voltage amplitude converting section 60 which includes CMOS transistors 62 and 64 formed in the N-type semiconductor substrate 80 and the P-type well region 90 and connected to operate at 2.5 V, and converts the logic signal from the logic processing section 50 to have voltage amplitude of 2.5 V. Particularly, the dual-power type integrated circuit further comprises a switching section 70, connected between the terminal VCCQ and the converting section 60, for applying the potential of the terminal VCCQ to the converting section 60 after the potential of the terminal VCC rises upon application of 3.3 V.

2 Claims, 3 Drawing Sheets

DUAL-POWER TYPE INTEGRATED CIRCUIT

TECHNICAL FIELD

The present invention relates to a dual-power type integrated circuit for converting voltage amplitude of a logic signal to be output, and particularly to a dual-power type integrated circuit formed by use of an N-type semiconductor substrate.

BACKGROUND ART

In the field of computer equipment, there is widely used an integrated circuit which processes a logic signal with voltage amplitude of 3.3 V. In recent years, there is developed an integrated circuit in which the logic signal is processed with voltage amplitude of below 3.3 V for the purpose of saving power. A dual-power type integrated circuit generates a logic signal with voltage amplitude of 3.3 V, and converts the voltage amplitude of the logic signal from 3.3 V to 2.5 V to be output.

The conventional dual-power type integrated circuit is formed by use of a P-type semiconductor substrate 10 as shown in FIG. 5. In this integrated circuit, a logic processing section 1 generates a logic signal with voltage amplitude of 3.3 V, and a voltage amplitude converting section 2 converts voltage amplitude of the logic signal supplied from the logic processing section 1 from 3.3 V to 2.5 V to be output. The logic processing section 1 is a CMOS inverter in which a P-channel MOS transistor TP formed in an N-type well NW1 and an N-channel MOS transistor TN formed in a semiconductor substrate 10 are connected to operate at a power voltage of 3.3 V. The voltage amplitude converting section 2 is a CMOS inverter in which a P-channel MOS transistor TP formed in an N-type well NW2 and an N-channel MOS transistor TN formed in the semiconductor substrate 10 are connected to operate at a power voltage of 2.5 V. The semiconductor substrate 10 is connected to a ground terminal GND (=0 V) through a P$^+$-type contact region C0. The well NW1 is connected to a power source terminal VCC (=3.3 V) through an N$^+$-type contact region C1. The well NW2 is connected to a power source terminal VCCQ (=2.5 V) through an N$^+$-type contact region C2.

In a case where an N-type semiconductor substrate 20 is used to form the dual-power type integrated circuit as shown in FIG. 6, the P-channel MOS transistor TP is formed in the N-type semiconductor substrate 20, the N-channel MOS transistor TN is formed in a P-type well PW, and the semiconductor substrate 20 is connected to the power source terminal VCCQ (=2.5 V) through the N$^+$-type contact region C2, so that the voltage amplitude converting section 2 can be made equivalent to that shown in FIG. 5.

However, if the stable operation of the logic processing section 1 has priority over other operations, the semiconductor substrate 20 must be connected to the power source terminal VCC (=3.3 V) through the N$^+$-type contact region C1, and the N$^+$-type contact region C2 is electrically separated from the power source terminal VCCQ.

This separation makes it difficult to ensure a reverse-bias of a diode D which is formed of a PN junction between the P$^+$-type source region of the P-channel MOS transistor TP and the N-type semiconductor substrate 20 as shown in FIG. 2. In other words, to reverse-bias the diode D, the potential of the power source terminal VCC (=3.3 V) must rise prior to the potential of the power source terminal VCCQ (=2.5 V) or simultaneously with the potential of VCCQ. If the potential of the power source terminal VCC rises later than that of the power source terminal VCCQ, the diode D is temporarily forward-biased. As a result, an excessive forward current flows in the diode D and current paths connecting the diode D with the power source terminals VCC and VCCQ. The current also flows in current paths connecting the power source terminals VCC and VCCQ with an external power supply device on a circuit board. This exerts unfavorable influence onto the other integrated circuits mounted on the circuit board. Or, there is possibility that element destruction will occur by the excessive forward current flowing in the diode D.

An object of the present invention is to provide a dual-power type integrated circuit, which can stably operate on an N-type semiconductor substrate.

DISCLOSURE OF THE INVENTION

A dual-power type integrated circuit is characterized by comprising: a reference potential terminal; a first power source terminal associated with the reference potential terminal to receive a first power voltage; a second power source terminal associated with the reference potential terminal to receive a second power voltage lower than the first power voltage; an N-type semiconductor substrate connected to the first power source terminal; a P-type well region formed in the N-type semiconductor substrate and connected to the reference potential terminal; a logic processing section, including CMOS transistors formed in the N-type semiconductor substrate and the P-type well region and connected to operate at the first power voltage, for generating a logic signal of voltage amplitude corresponding to the first power voltage; a voltage amplitude converting section, including CMOS transistors formed in the N-type semiconductor substrate and the P-type well region and connected to operate at the second power voltage, for converting the logic signal from the logic processing section to have voltage amplitude corresponding to the second power voltage; and switching means, connected between the second power source terminal and the voltage amplitude converting section, for applying a potential of the second power source terminal to the voltage amplitude converting section after a potential of the power source terminal rises upon application of the first power voltage.

According to the dual-power type integrated circuit, the switching means does not apply the potential of the second power source terminal to the voltage amplitude converting section until the potential of the first power source terminal rises upon application of the first power voltage. As a result, even if the potential of the first power source terminal rises later than the potential of the second power source terminal, no excessive forward current flows in a diode formed of the PN junction existing between the P-channel transistor of the CMOS transistors and the N-type semiconductor substrate. Therefore, it is possible to prevent element destruction of the dual-power type integrated circuit which is formed by use of the N-type semiconductor substrate.

BEST MODE OF CARRYING OUT THE INVENTION

A dual-power type integrated circuit according to one embodiment of the present invention will now be described with reference to the accompanying drawings.

Figure 1:
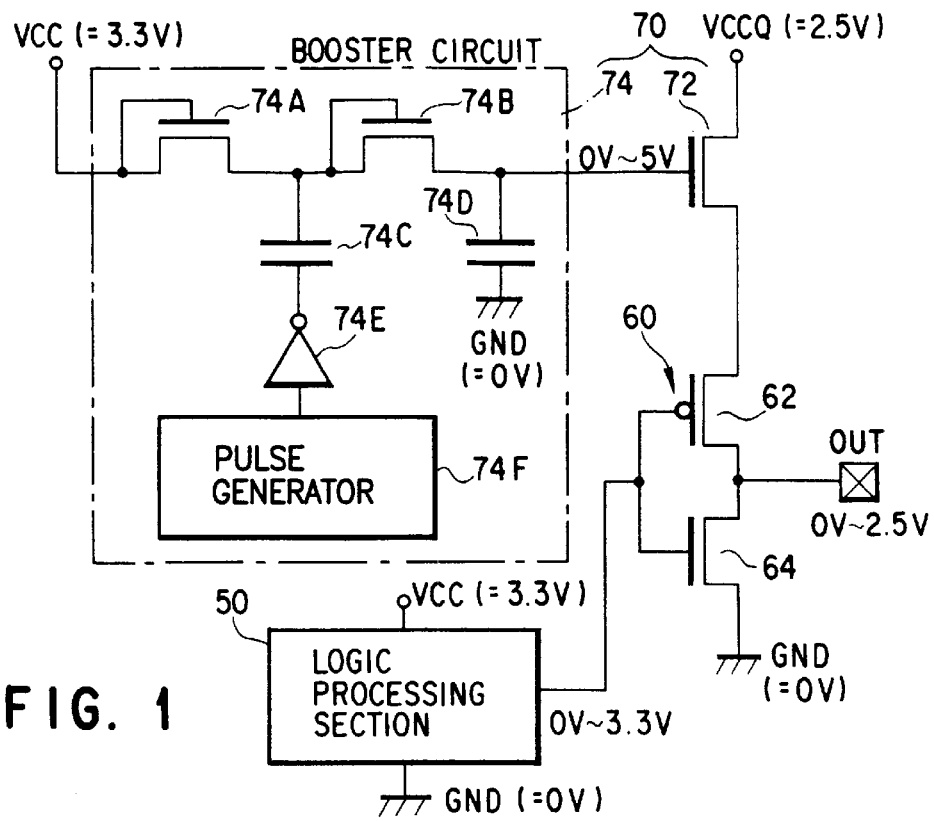
FIG. 1 is a block diagram showing a circuit structure of a dual-power type integrated circuit according to one embodiment of the present invention.
Figure 2:
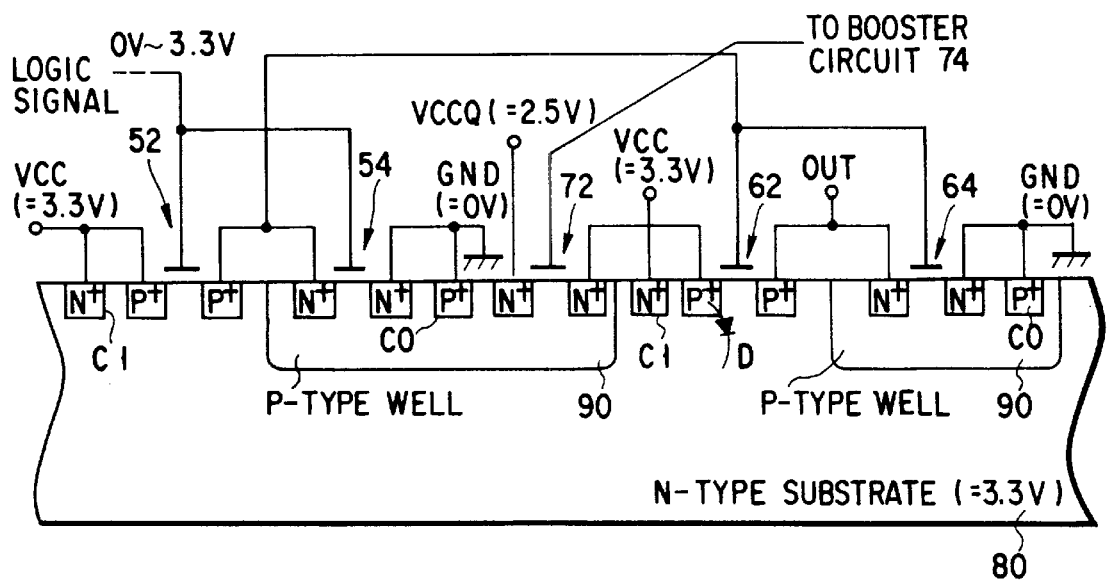
FIG. 2 is a cross-sectional view partially showing a cross-sectional structure of the dual-power type integrated circuit shown in FIG. 1.

FIG. 1 shows the circuit structure of the dual-power type integrated circuit, and FIG. 2 partially shows a cross-sectional structure of the dual-power type integrated circuit. The dual-power type integrated circuit comprises a ground terminal GND, a power source terminal VCC, a power source terminal VCCQ, a logic processing section 50, and a voltage amplitude converting section 60. The ground terminal GND is set to a reference potential of 0 V. A first power voltage of 3.3 V is applied between the power source terminal VCC and the ground terminal GND. A second power voltage of 2.5 V lower than the first power voltage of 3.3 V is applied with respect to the ground terminal GND. The logic processing section 50 generates a logic signal of voltage amplitude corresponding to the first power voltage of 3.3 V. The voltage amplitude converting section 60 converts the logic signal from the logic processing section 50 to have voltage amplitude corresponding to the second power voltage of 2.5 V to be output. The dual-power type integrated circuit further comprises a switching section 70 connected between the power source terminal VCCQ and the voltage amplitude converting section 60. The switching section 70 applies the potential of the power source terminal VCCQ to the voltage amplitude converting section 60 after the potential of the power source terminal VCC rises.

As shown in FIG. 2, the dual-power type integrated circuit is formed by use of an N-type semiconductor substrate 80. The N-type semiconductor substrate 80 has a plurality of P-type wells 90 formed in one surface of the semiconductor substrate 80. The N-type semiconductor substrate 80 is connected to the power source terminal VCC through a plurality of N$^+$-type contact regions C1. These P-type wells 90 are connected to the ground terminal GND through a plurality of P$^+$-type contact regions C0. The logic processing section 50 includes a P-channel MOS transistor 52 formed in the N-type semiconductor substrate 80 and an N-channel MOS transistor 54 formed in the P-type well 90. The voltage amplitude converting section 60 includes a P-channel MOS transistor 62 formed in the N-type semiconductor substrate 80 and an N-channel MOS transistor 64 formed in the P-type well 90. The MOS transistors 52 and 54 are connected to each other to serve as a CMOS inverter which operates at the first power voltage of 3.3 V. The MOS transistors 62 and 64 are connected to each other to serve as a CMOS inverter which operates at the second power voltage of 2.5 V. The drains of the MOS transistors 52 and 54 are connected to each other and commonly connected to gates of MOS transistors 62 and 64. The drains of the MOS transistors 62 and 64 are connected to a signal output terminal OUT to be connected to an external circuit for processing the logic signal with voltage amplitude of 2.5 V.

The switching section 70 includes an N-channel MOS transistor 72 formed in the P-type well 90 and a booster circuit 74 which boosts the first power voltage up to 5 V, that is, at least twice as high as the second power voltage upon application of the first power voltage, and applies the boosted first power voltage to the N-channel MOS transistor 72 as a gate voltage. A current path of the MOS transistor 72 is connected at one end to the power source terminal VCCQ and at the other end to the ground GND through a series of current paths of the MOS transistors 62 and 64.

The booster circuit 74 includes an N-channel MOS transistors 74A and 74B, capacitors 74C and 74D, a CMOS inverter 74E, and a pulse generator 74F. The power source terminal VCC is connected to a source of the MOS transistor 74A. A drain of the MOS transistor 74A is connected to a source of the MOS transistor 74B. A drain of the MOS transistor 74B is connected to a gate of the MOS transistor 72. Each gate of the MOS transistors 74A and 74B is connected to the source thereof. The pulse generator 74F generates a clock pulse of a predetermined frequency, and supplies the clock pulse to an input terminal of the inverter 74E. The capacitor 74C is connected between an output terminal of the inverter 74E and a node between the MOS transistors 74A and 74B. The capacitor 74D is connected between the drain of the MOS transistor 74B and the ground terminal GND. The pulse generator 74F may be replaced with an input pad for receiving a clock pulse generated outside of the dual-power type integrated circuit.

The aforementioned dual-power type integrated circuit is operates with the first power voltage of 3.3 V and the second power voltage of 2.5 V. The potential of the power source terminal VCC is boosted from 3.3 V to 5 V by the booster circuit 74 upon application of the first power voltage and supplied to the gate of the N-channel MOS transistor 72. Thereby, if the MOS transistor 72 is turned on, the potential of the power source terminal VCCQ is applied to the source of the MOS transistor 62 through the MOS transistor 72. When the logic processing section 50 outputs a logic signal of 0 V, the MOS transistor 62 is turned on to set the potential of the signal output terminal OUT to 2.5 V. On the other hand, when the logic processing section 50 outputs a logic signal of 3.3 V, the MOS transistor 64 is turned on to set the potential of the signal output terminal OUT to 0 V.

According to the dual-power type integrated circuit of the present embodiment, the MOS transistor 72 is controlled not to be turned on before the potential of the power source terminal VCCQ rises. Even if the potential of the power source terminal VCCQ rises earlier than the potential of the power source terminal VCC, the potential of the power source terminal VCCQ is not applied to the source of the MOS transistor 62. As a result, an excessive forward current does not temporarily flow in the diode D formed of the PN junction existing between the P$^+$-type region and the N-type semiconductor substrate 80. Therefore, it is possible to prevent element destruction of the dual-power type integrated circuit formed by use of the N-type semiconductor substrate 80.

Figure 3:
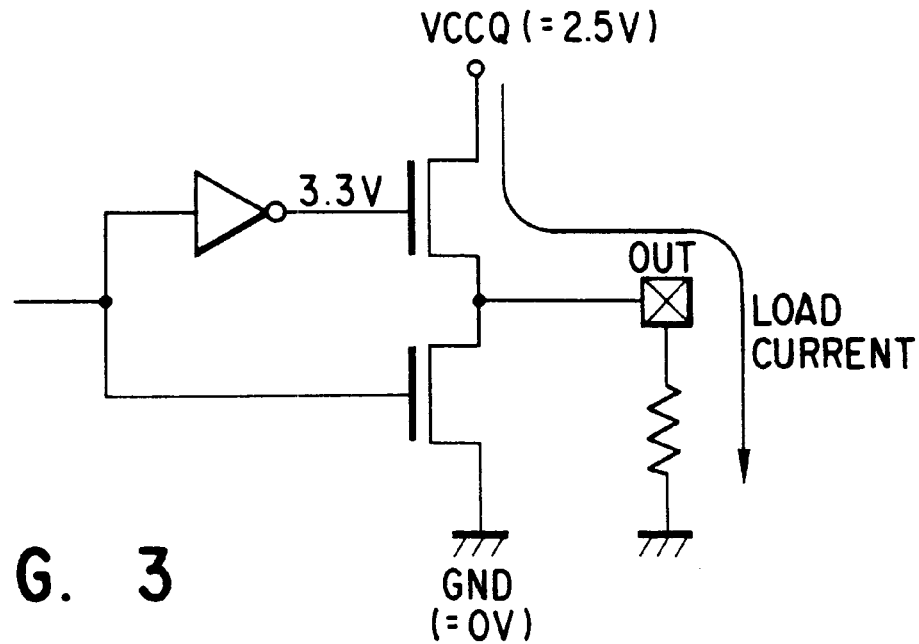
FIG. 3 is a view showing a first example to be compared with the dual-power type integrated circuit shown in FIGS. 1 and 2.

The inventor has presumed that the problem of excessive current can be solved by forming the voltage amplitude converting section with the first and second N-channel MOS transistors which operate at the power voltage of 2.5 V as shown in FIG. 3, for example. More specifically, the current path of the first MOS transistor is connected between the power source terminal VCCQ and the signal output terminal OUT, and the current path of the second MOS transistor is connected between the signal output terminal OUT and the ground terminal GND. The signal input terminal is connected to the gate of the first MOS transistor through the inverter which operates at the power voltage of 3.3 V, and directly connected to the gate of the second MOS transistor. However, according to this structure, sufficiently low turn-on resistance can not be obtained in the first MOS transistor. Due to this, when the load current flows through the signal output terminal OUT, the voltage drop occurs in the first MOS transistor in accordance with the load current, and this causes a fall in the potential of the signal output terminal OUT.

Figure 4:
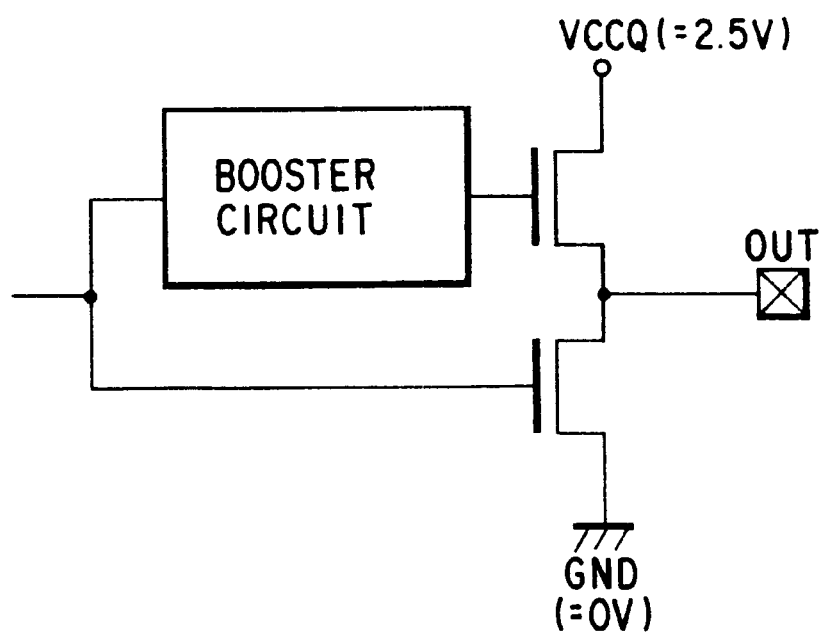
FIG. 4 is a view showing a second example to be compared with the dual-power type integrated circuit shown in FIGS. 1 and 2.
Figure 5:
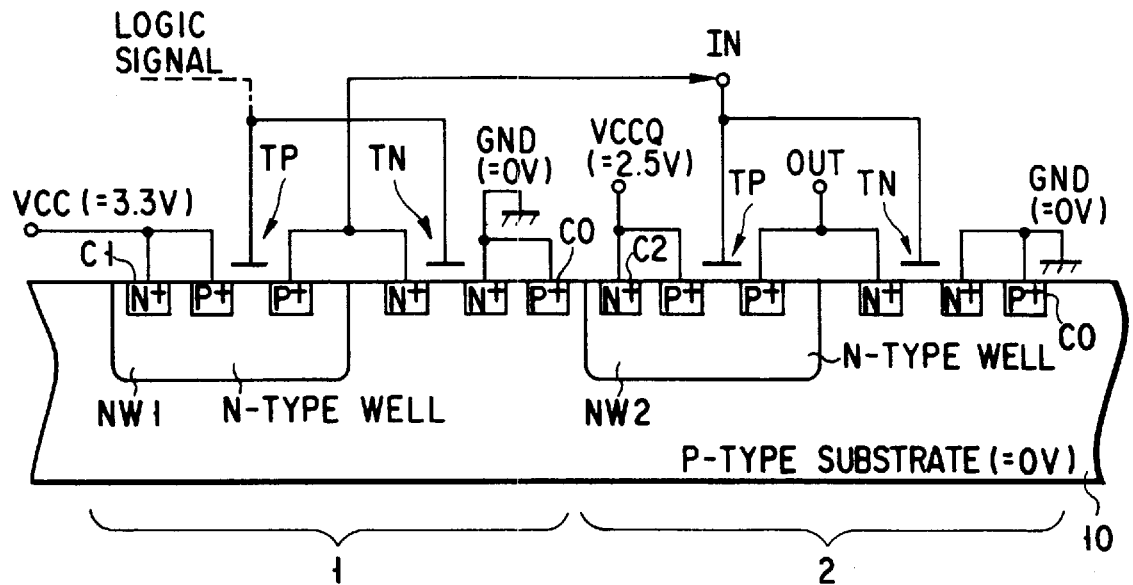
FIG. 5 is a cross-sectional view partially showing a cross-sectional structure of a conventional dual-power type integrated circuit.
Figure 6:
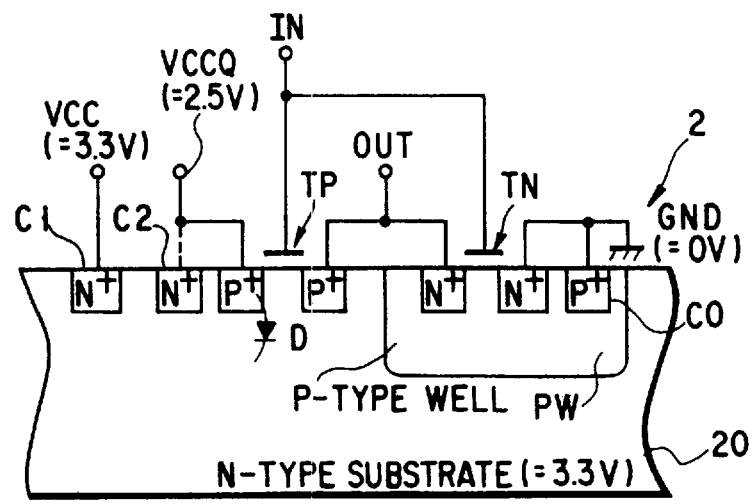
FIG. 6 is a cross-sectional view for explaining a problem caused when the dual-power type integrated circuit shown in FIG. 5 is formed by use of an N-type semiconductor substrate.

Moreover, it has been presumed that the fall in the potential of the signal output terminal can be solved by providing a booster circuit which boosts the logic signal of 3.3 V to about 5 V upon rise of the logic signal from the inverter as shown in FIG. 4. However, an access time characteristic of the dual-power type integrated circuit is deteriorated due to delay caused by the operation of the booster circuit.

The dual-power type integrated circuit of this embodiment is useful to avoid the problems inherent to the structures of FIGS. 3 and 4.

The present invention is not limited to the above-mentioned embodiment, and various modifications may be made without departing from the spirit or scope of the present invention. For example, even if VCC=3.3 V, VCCQ=2.5 V are changed to the other voltage values, VCC=5 V, VCCQ=3.3 V, it is obvious that the present invention can be achieved.

INDUSTRIAL APPLICABILITY

According to the dual-power type integrated circuit of the present invention, it can stably operate on an N-type semiconductor substrate.

I claim:

1. A dual-power type integrated circuit comprising:

a reference potential terminal;

a first power source terminal associated with said reference potential terminal to receive a first power voltage;

a second power source terminal associated with said reference potential terminal to receive a second power voltage lower than the first power voltage;

an N-type semiconductor substrate connected to said first power source terminal;

a P-type well region formed in said N-type semiconductor substrate and connected to said reference potential terminal;

a logic processing section, including CMOS transistors formed in said N-type semiconductor substrate and said P-type well region and connected to operate at said first power voltage, for generating a logic signal of voltage amplitude corresponding to said power voltage;

a voltage amplitude converting section, including CMOS transistors formed in said N-type semiconductor substrate and said P-type well region and connected to operate at said second power voltage, for converting the logic signal from said logic processing section to have voltage amplitude corresponding to said second power voltage; and switching means, connected between said second power source terminal and said voltage amplitude converting section, for applying a potential of said second power source terminal to said voltage amplitude converting section after a potential of said power source terminal rises upon application of the first power voltage.

2. The dual-power type integrated circuit according to claim 1, wherein said switching means includes an N-channel transistor formed in said P-type well region and having a current path connected between the second power source terminal and said voltage amplitude converting section, and a booster circuit for boosting the first power voltage to be applied to said N-channel transistor as a gate voltage.

* * * * *